(12) United States Patent
Shuto (10) Patent No.: US 7,551,472 B2
(45) Date of Patent: Jun. 23, 2009

(54) FERROELECTRIC SEMICONDUCTOR MEMORY DEVICE

(75) Inventor: Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 11/896,044

(22) Filed: Aug. 29, 2007

(65) Prior Publication Data

US 2008/0055962 A1    Mar. 6, 2008

(30) Foreign Application Priority Data

Aug. 30, 2006    (JP)    ............... 2006-233273

(51) Int. Cl.
*G11C 11/00* (2006.01)
(52) U.S. Cl. ...................... 365/145; 365/173
(58) Field of Classification Search ................. 365/145, 365/173
See application file for complete search history.

(56) References Cited

U.S. PATENT DOCUMENTS 5,903,492 A    5/1999    Takashima 7,061,788 B2*    6/2006    Ogiwara et al. ............. 365/145
2005/0002247 A1*    1/2005    Kamoshida et al. ......... 365/201

FOREIGN PATENT DOCUMENTS

JP    10-255483    9/1998

* cited by examiner

*Primary Examiner*—Michael T Tran
(74) *Attorney, Agent, or Firm*—Finnegan, Henderson, Farabow, Garrett & Dunner, L.L.P.

(57) ABSTRACT

A memory cell includes a ferroelectric capacitor for holding a charge and a transistor connected in parallel with the ferroelectric capacitor. A plurality of the ferroelectric memory cells are connected in series to form a memory cell block. A selection transistor connects, to one end of the block. A bit line connects to the selection transistor. A plate line connects to the other end of the block. A control circuit changes potentials of the word line and the bit line. With the potential of the plate line being held constant, the potential of the word line is changed, thereby erasing information or writing information to the ferroelectric memory cells.

11 Claims, 10 Drawing Sheets

|  | BL | BS | WL1 | WL2 | WL3 | WL4 | PL |
|---|---|---|---|---|---|---|---|
| Step-1 | 0 [V] | OFF | ON | ON | ON | ON | Vcc [V] |
| Step-2 | Floating | OFF | ON | ON | ON | OFF | Vcc [V] |
| Step-3 | Read | ON | ON | ON | ON | OFF | Vcc [V] |
| Step-4 | Read finished | OFF | ON | ON | ON | OFF | Vcc [V] |
| Step-5 | 0 [V] | OFF | ON | ON | ON | ON | Vcc [V] |
| Step-6 | Floating | OFF | ON | ON | OFF | ON | Vcc [V] |
| Step-7 | Read | ON | ON | ON | OFF | ON | Vcc [V] |
| Step-8 | Read finished | OFF | ON | ON | OFF | ON | Vcc [V] |
| Step-9 | 0 [V] | OFF | ON | ON | ON | ON | Vcc [V] |
| Step-10 | Floating | OFF | ON | OFF | ON | ON | Vcc [V] |
| Step-11 | Read | ON | ON | OFF | ON | ON | Vcc [V] |
| Step-12 | Read finished | OFF | ON | OFF | ON | ON | Vcc [V] |
| Step-13 | 0 [V] | OFF | ON | ON | ON | ON | Vcc [V] |
| Step-14 | Floating | OFF | OFF | ON | ON | ON | Vcc [V] |
| Step-15 | Read | ON | OFF | ON | ON | ON | Vcc [V] |

| | BL | BS | WL1 | WL2 | WL3 | WL4 | PL |
|---|---|---|---|---|---|---|---|
| Step-1 | 0 [V] | OFF | ON | ON | ON | ON | Vcc [V] |
| Step-2 | 0 [V] | OFF | ON | ON | ON | OFF | Vcc [V] |
| Step-3 | 0 [V] | ON | ON | ON | ON | OFF | Vcc [V] |
| Step-4 | 0 [V] | ON | ON | ON | OFF | OFF | Vcc [V] |
| Step-5 | 0 [V] | ON | ON | ON | OFF | ON | Vcc [V] |
| Step-6 | 0 [V] | ON | ON | OFF | OFF | ON | Vcc [V] |
| Step-7 | 0 [V] | ON | ON | OFF | ON | ON | Vcc [V] |
| Step-8 | 0 [V] | ON | OFF | OFF | ON | ON | Vcc [V] |
| Step-9 | 0 [V] | ON | OFF | ON | ON | ON | Vcc [V] |
| Step-10 | 0 [V] | OFF | OFF | ON | ON | ON | Vcc [V] |
| Step-11 | 0 [V] | OFF | ON | ON | ON | ON | Vcc [V] |

FIG. 5

|         | BL     | BS  | WL1 | WL2 | WL3 | WL4 | PL    |
|---------|--------|-----|-----|-----|-----|-----|-------|
| Step-1  | 0 [V]  | OFF | ON  | ON  | ON  | ON  | 0 [V] |
| Step-2  | 0 [V]  | OFF | ON  | ON  | ON  | OFF | 0 [V] |
| Step-3  | Data-4 | ON  | ON  | ON  | ON  | OFF | 0 [V] |
| Step-4  | 0 [V]  | OFF | ON  | ON  | OFF | OFF | 0 [V] |
| Step-5  | Data-3 | ON  | ON  | ON  | OFF | ON  | 0 [V] |
| Step-6  | 0 [V]  | OFF | ON  | OFF | OFF | ON  | 0 [V] |
| Step-7  | Data-2 | ON  | ON  | OFF | ON  | ON  | 0 [V] |
| Step-8  | 0 [V]  | OFF | OFF | OFF | ON  | ON  | 0 [V] |
| Step-9  | Data-1 | ON  | OFF | ON  | ON  | ON  | 0 [V] |
| Step-10 | 0 [V]  | OFF | OFF | ON  | ON  | ON  | 0 [V] |
| Step-11 | 0 [V]  | OFF | ON  | ON  | ON  | ON  | 0 [V] |

FIG. 6

|        | BL    | BS  | WL1 | WL2 | WL3 | WL4 | PL      |
|--------|-------|-----|-----|-----|-----|-----|---------|
| Step-1 | 0 [V] | OFF | ON  | ON  | ON  | ON  | 0 [V]   |
| Step-2 | 0 [V] | ON  | ON  | ON  | ON  | OFF | 0 [V]   |
| Step-3 | 0 [V] | ON  | ON  | ON  | ON  | OFF | Vcc [V] |
| Step-4 | 0 [V] | ON  | ON  | ON  | ON  | OFF | 0 [V]   |
| Step-5 | Data  | ON  | ON  | ON  | ON  | OFF | 0 [V]   |
| Step-6 | 0 [V] | ON  | ON  | ON  | ON  | ON  | 0 [V]   |

|  | BL | BS | WL1 | WL2 | WL3 | WL4 | PL |
|---|---|---|---|---|---|---|---|
| Step-1 | 0 [V] | OFF | ON | ON | ON | ON | Vcc [V] |
| Step-2 | Floating | OFF | ON | ON | ON | OFF | Vcc [V] |
| Step-3 | Read | ON | ON | ON | ON | OFF | Vcc [V] |
| Step-4 | Read finished | OFF | ON | ON | ON | OFF | Vcc [V] |
| Step-5 | 0 [V] | OFF | ON | ON | ON | ON | Vcc [V] |
| Step-6 | Floating | OFF | ON | ON | OFF | ON | Vcc [V] |
| Step-7 | Read | ON | ON | ON | OFF | ON | Vcc [V] |
| Step-8 | Read finished | OFF | ON | ON | OFF | ON | Vcc [V] |
| Step-9 | 0 [V] | OFF | ON | ON | ON | ON | Vcc [V] |
| Step-10 | Floating | OFF | ON | OFF | ON | ON | Vcc [V] |
| Step-11 | Read | ON | ON | OFF | ON | ON | Vcc [V] |
| Step-12 | Read finished | OFF | ON | OFF | ON | ON | Vcc [V] |
| Step-13 | 0 [V] | OFF | ON | ON | ON | ON | Vcc [V] |
| Step-14 | Floating | OFF | OFF | ON | ON | ON | Vcc [V] |
| Step-15 | Read | ON | OFF | ON | ON | ON | Vcc [V] |

FERROELECTRIC SEMICONDUCTOR MEMORY DEVICE

CROSS REFERENCE TO RELATED APPLICATIONS

This application is based on and claims the benefit of priority from prior Japanese Patent Application No. 2006-233273, filed on Aug. 30, 2006, the entire contents of which are incorporated herein by reference.

BACKGROUND OF THE INVENTION

1. Field of the Invention

The present invention relates to a ferroelectric semiconductor memory device and, more particularly, to a ferroelectric semiconductor memory device including a plurality of ferroelectric memory cells, each cell including a ferroelectric capacitor and a transistor connected thereto.

2. Description of the Related Art

JP 10-255483 A describes, as one of the semiconductor memory devices, a ferroelectric memory that is referred to as a TC parallel unit series-connected ferroelectric memory (also referred to as "Chain type FeRAM"). The TC parallel unit series-connected ferroelectric memory includes a plurality of ferroelectric memory cells, each cell including a ferroelectric capacitor and a transistor connected thereto.

The conventional TC parallel unit series-connected ferroelectric memory, which is a ferroelectric memory, writes information to the ferroelectric memory cell by a combination of erasing written information and writing new information. The ferroelectric memory cell should thus be erased before being written with new information. Because the cell should be erased in advance, writing information to the ferroelectric memory cell takes too much time. This is an obstacle to a high-speed writing, i.e., a rapid storage to the semiconductor memory device.

The ferroelectric memory needs to increase and decrease a voltage of a plate line used to erase and write information. Unfortunately, the plate line is connected to a ferroelectric capacitor having a large capacitance and a transistor diffusion layer and the like. The plate line thus has a large capacity, thereby taking a long time to increase and decrease the potential of the plate line. Further, a large amount of data needs to be written to the ferroelectric memory by repeatedly erasing and writing data every time the data is written to the memory. This requires increase and decrease of the plate line potential every data write, thus making it difficult to provide a high-speed writing.

SUMMARY OF THE INVENTION

A ferroelectric semiconductor memory device according to one aspect of the present invention comprises: a memory cell block including a plurality of ferroelectric memory cells connected in series, each memory cell including a ferroelectric capacitor for holding a charge and a transistor connected in parallel with the ferroelectric capacitor; word lines connected to the respective transistors; a selection transistor connected to one end of the block; a bit line connected to the selection transistor; a plate line connected to another end of the block; and a control circuit for changing potentials of the word line and the bit line, with the potential of the plate line being held constant, the potential of the word-line being changed, thereby erasing information or writing information to the ferroelectric memory cells.

A ferroelectric semiconductor memory device according to one aspect of the present invention comprises: a memory cell block including a plurality of ferroelectric memory cells connected in series, each memory cell including a ferroelectric capacitor for holding a charge and a transistor connected in parallel with the ferroelectric capacitor; word lines connected to the respective transistors; a selection transistor connected to one end of the block; a bit line connected to the selection transistor; a plate line connected to another end of the block; and a control circuit for changing potentials of the word line and the bit line, with the potential of the plate line being held constant, the bit line being made electrically floating and then a potential of the word line connected to the transistor being changed, thereby reading to the bit line information stored in a plurality of ferroelectric capacitors connected to the transistor.

Another aspect of the present invention is directed to a method of writing or erasing information of a ferroelectric semiconductor memory device. The device includes: a memory cell block including a plurality of ferroelectric memory cells connected in series, each memory cell including a ferroelectric capacitor for holding a charge and a transistor connected in parallel with the ferroelectric capacitor; word lines connected to the respective transistors; a selection transistor connected to one end of the block; a bit line connected to the selection transistor; and a plate line connected to another end of the block. The method includes: a first step of turning on, with the selection transistor being held off, all of the transistors in the block; a second step of switching, with the selection transistor being held off, one of the transistors from on to off; and a third step of switching, with the one of the transistors being held off, the selection transistor from off to on.

DETAILED DESCRIPTION OF THE EMBODIMENTS

First Embodiment

An embodiment of the present invention is described below.

This embodiment relates to methods of erasing and writing information to a TC parallel unit series-connected ferroelectric memory, which is a ferroelectric memory.

[Entire Configuration of Ferroelectric Memory Cell]

Figure 1:
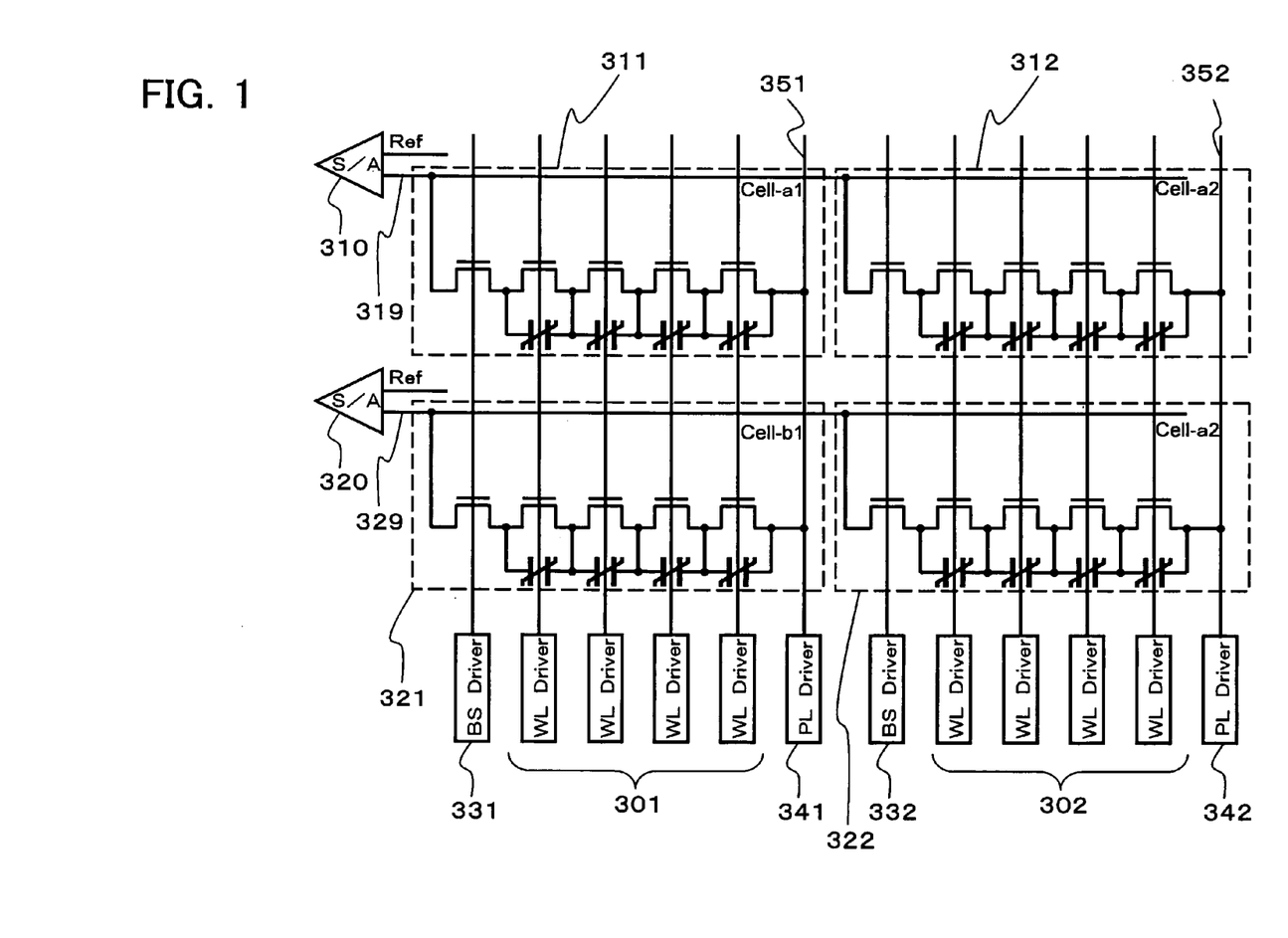
FIG. 1 shows an arrangement of a ferroelectric memory cell array of a ferroelectric semiconductor memory device according to the present embodiment.

FIG. 1 shows a configuration of a ferroelectric memory cell array in this embodiment. Referring to FIG. 1, the memory cell array includes cell units 311, 312, 321, and 322 arranged two-dimensionally. Each cell unit includes a memory cell block and a selection transistor connected to one end of the block. The block includes a plurality of ferroelectric memory cells connected in series. Each memory cell includes a ferroelectric capacitor and a transistor connected thereto. A set of cell units arrayed along the lateral direction in FIG. 1 connects to a common bit line 319. Another set of cell units in the lateral direction connects to a common bit line 329. The bit lines 319 and 329 connect to corresponding sense amplifiers 310 and 320, respectively. A set of cell units in the vertical direction in FIG. 1 connects to a plate line 351. Another set of cell units arrayed along the vertical direction connects to a plate line 352. The plate lines 351 and 352 connect to corresponding plate line drivers (PL Drivers) 341 and 342, respectively. Each of the selection transistors connects to a common.BS driver 331 or 332. Each of the transistors in the ferroelectric memory cells connects to a common word-line driver (WL Driver) 301 or 302.

The ferroelectric memory cell array in this embodiment is thus configured.

Figure 2:
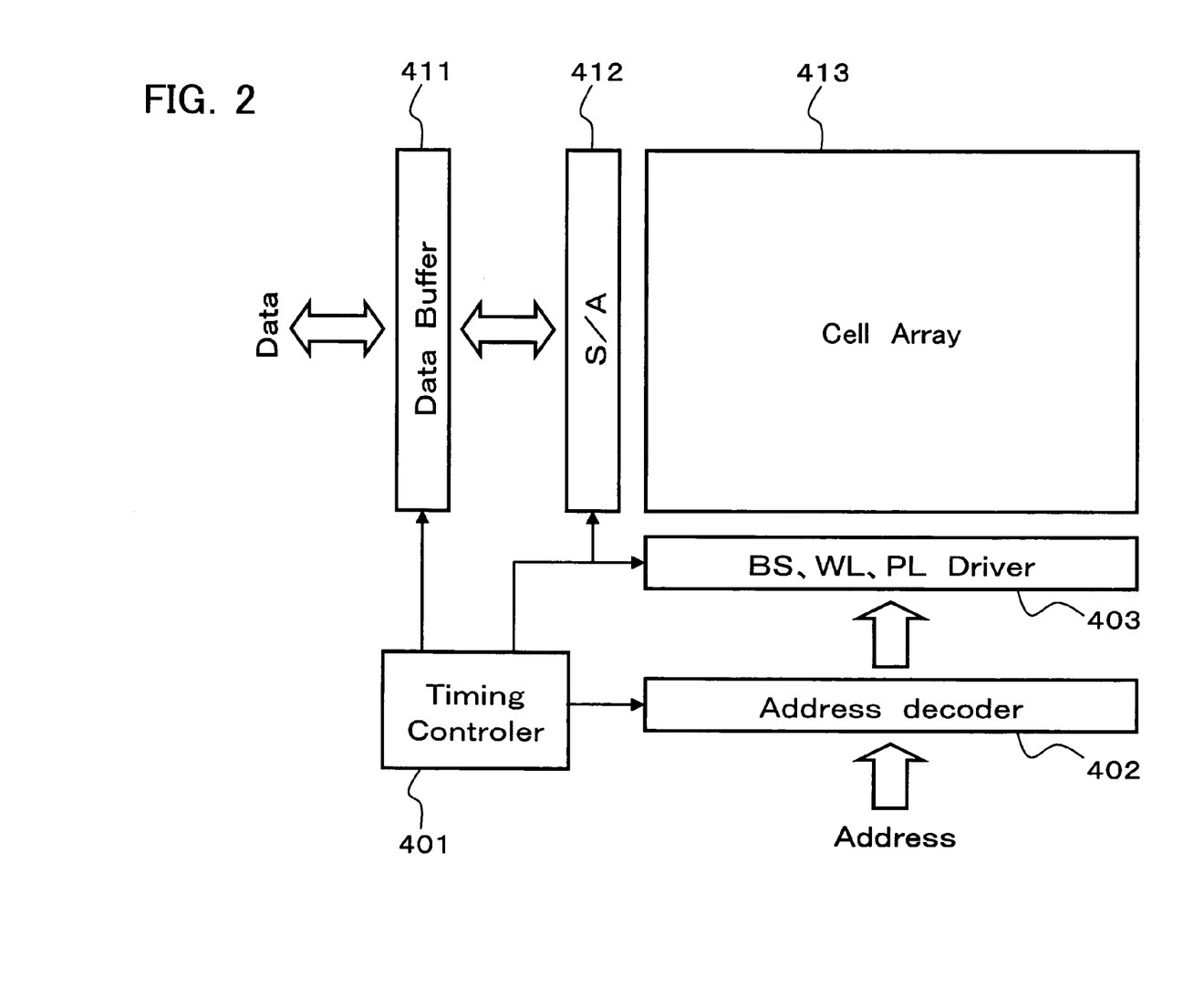
FIG. 2 is a block diagram of a configuration of a ferroelectric semiconductor memory device according to the present embodiment.

FIG. 2 is a block diagram of a ferroelectric semiconductor memory device including a ferroelectric memory cell in this embodiment. Referring to FIG. 2, a cell array 413 including ferroelectric memory cells may receive and output data via a sense amplifier 412 and a data buffer 411. The cell array 413 may also receive an address via BS/WL/PL driver 403 and an address decoder 402. The data input/output and the address input are controlled by a timing counter 401. The control circuit of the ferroelectric memory cell thus includes the timing counter 401, the address decoder 402, the BS/WL/PL driver 403, the data buffer 411, and the sense amplifier 412. Information may thus be erased or written as described above, or be read as described below.

[Ferroelectric Memory Configuration]

Figure 3:
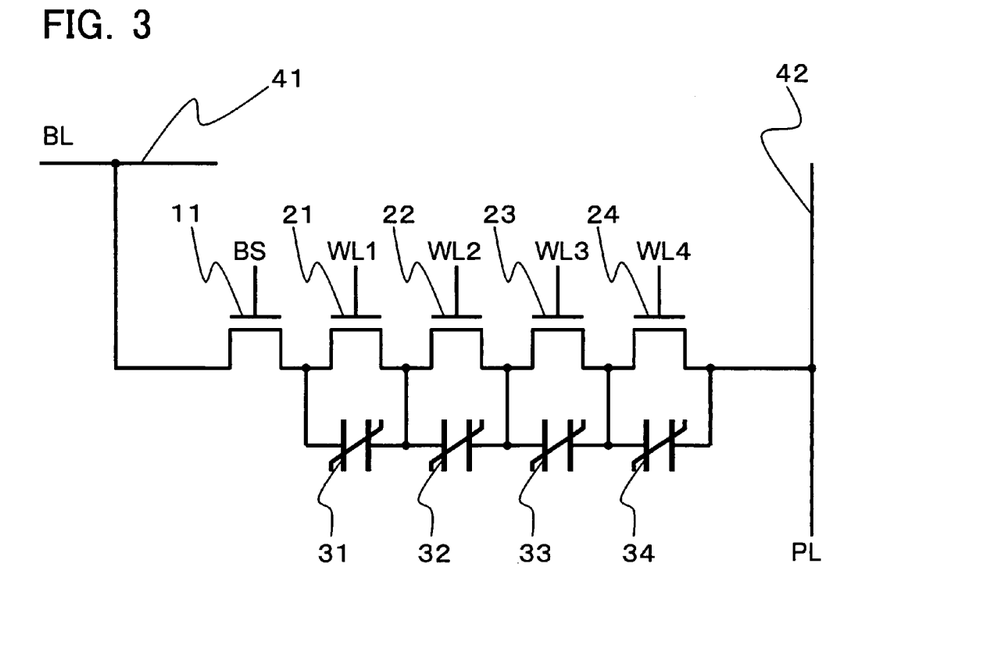
FIG. 3 is a configuration diagram of a ferroelectric memory cell array of a ferroelectric semiconductor memory device according to the present invention.

FIG. 3 shows a configuration of the block in the TC parallel unit series-connected ferroelectric memory, which is a ferroelectric memory, used in this embodiment. The ferroelectric semiconductor memory device in this embodiment includes a plurality of the blocks. The blocks are arrayed, for example, two dimensionally.

The block of the TC parallel unit series-connected ferroelectric memory, which is a ferroelectric memory, used in this embodiment includes a ferroelectric memory cell. The memory cell includes a ferroelectric capacitor 31 and a transistor 21 connected thereacross. The transistor 21 connects to a word line WL1 at its gate. A voltage of the word line WL1 may be controlled to turn on and off the transistor 21.

Likewise, ferroelectric capacitors 32, 33, and 34, and transistors 22, 23, and 24 connected across the respective capacitors form ferroelectric memory cells. The ferroelectric memory cells are connected in series to form the block. The transistors 22, 23, and 24 connect to word lines WL2, WL3, and WL4, respectively. Voltages of the word lines WL2, WL3, and WL4 may be controlled to turn on and off the corresponding transistors 22, 23, and 24, respectively.

One end of the block, i.e., one end of the ferroelectric memory cell including the ferroelectric capacitor 31 and the transistor 21 has a selection transistor (BS) 11 connected thereto. The one end connects, via the selection transistor (BS) 11, to a bit line (BL) 41. The other end of the block, i.e., one end of the ferroelectric memory cell including the ferroelectric capacitor 34 and the transistor 24 connects to a plate line (PL) 42.

[Erase Method]

Figure 4:
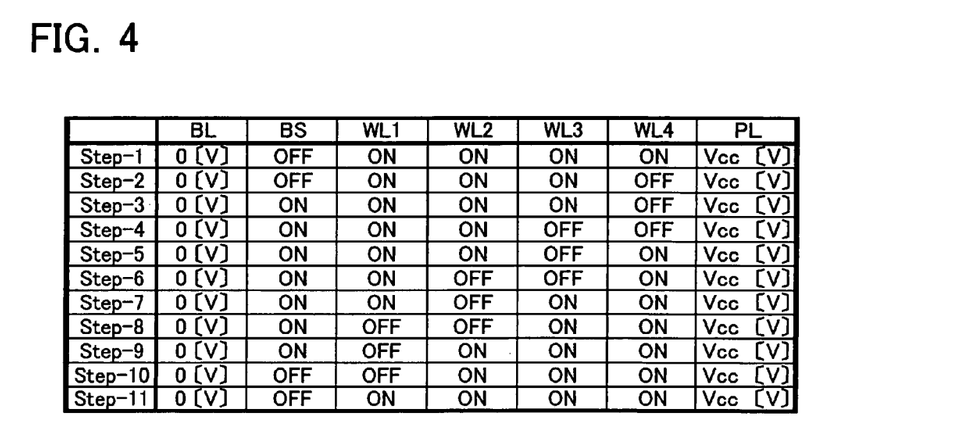
FIG. 4 shows steps of a method of erasing a ferroelectric semiconductor memory device in a first embodiment.

Referring to FIG. 4, a method of erasing the ferroelectric memory cell in the block shown in FIG. 3 is described.

The ferroelectric memory cell in the block in this embodiment may be erased with the bit line BL applied with a constant voltage of 0 [V] and the plate line PL applied with a constant voltage of Vcc [V]. The voltage applied to the plate line PL remains unchanged unlike the general erasing and writing as described below. Note that Vcc [V] is a voltage sufficient to erase one ferroelectric memory cell.

Then, at first Step-1, the word lines WL1, WL2, WL3, and WL4 are all applied with a voltage sufficient to turn them on, and the selection transistor (BS) 11 is off.

Information is then erased in the ferroelectric memory cell including the ferroelectric capacitor 34 and the transistor 24.

Specifically, at Step-2, with all of the word lines WL1, WL2, and WL3 being applied with a voltage sufficient to turn them on, the word line WL4 is applied with a voltage to turn it off. The selection transistor (BS) 11 remains off.

Then at Step-3, with all of the word lines WL1, WL2, and WL3 being applied with a voltage sufficient to turn them on and the word line WL4 being applied with a voltage to turn it off, the selection transistor (BS) 11 is turned on. Only the transistor 24 is thus off, so the voltage applied between the bit line BL and the plate line PL is applied to the ferroelectric capacitor 34, thereby erasing information stored in the ferroelectric capacitor 34.

This embodiment includes Step-2 for the following reason. If control directly proceeds from Step-1 to Step-3, the switching timing between the selection transistor (BS) 11 and the transistor 24 may turn on all of the selection transistor (BS) 11 and transistors 21, 22, 23, and 24. This may short the bit line BL and the plate line PL, thus flowing a through current. The through current may destruct devices such as a transistor or increase the power consumption. Step-2 may reduce such disadvantages. Specifically, at Step-2, the word line WL4 is applied with a voltage to turn it off and the selection transistor (BS) 11 is turned off, thereby reducing a short circuit between the bit line BL and the plate line PL.

Information is then eased in the ferroelectric memory cell including the ferroelectric capacitor 33 and the transistor 23.

Specifically, at Step-4, with both of the word lines WL1 and WL2 being applied with a voltage sufficient to turn them on and the word line WL4 being applied with a voltage to turn it off, the word line WL3 is applied with a voltage to turn it off. The selection transistor (BS) 11 remains on.

Then at Step-5, with both of the word lines WL1 and WL2 being applied with a voltage sufficient to turn them on, the word line WL3 being applied with a voltage to turn it off, and the selection transistor (BS) 11 being on, the word line WL4 is applied with a voltage to turn it on. Only the transistor 23 is thus off, so the voltage applied between the bit line BL and the plate line PL is applied to the ferroelectric capacitor 33, thereby erasing information stored in the ferroelectric capacitor 33.

This embodiment includes Step-4 for the following reason. If control directly proceeds from Step-3 to Step-5, the switching timing between the transistors 23 and 24 may turn on all of the selection transistor (BS) 11 and transistors 21, 22, 23, and 24. This may short the bit line BL and the plate line PL, thus flowing a through current. The through current may destruct devices such as a transistor or increase the power consumption. Step-4 may reduce such disadvantages. Specifically, at Step-4, both of the word lines WL3 and WL4 are applied with a voltage to turn them off, thereby reducing a short circuit between the bit line BL and the plate line PL.

Information is then erased in the ferroelectric memory cell including the ferroelectric capacitor 32 and the transistor 22.

Specifically, at Step-6, with both of the word lines WL1 and WL4 being applied with a voltage sufficient to turn them on and the word line WL3 being applied with a voltage to turn it off, the word line WL2 is applied with a voltage to turn it off. The selection transistor (BS) 11 remains on.

At Step-7, with both of the word lines WL1 and WL4 being applied with a voltage sufficient to turn them on, the word line WL2 being applied with a voltage to turn it off, and the selection transistor (BS) 11 being on, the word line WL3 is applied with a voltage to turn it on. Only the transistor 22 is thus off, so the voltage applied between the bit line BL and the plate line PL is applied to the ferroelectric capacitor 32, thereby erasing information stored in the ferroelectric capacitor 32.

This embodiment includes Step-6 for the following reason. If control directly proceeds from Step-5 to Step-7, the switching timing between the transistors 22 and 23 may turn on all of the selection transistor (BS) 11 and transistors 21, 22, 23, and 24. This may short the bit line BL and the plate line PL, thus flowing a through current. The through current may destruct devices such as a transistor or increase the power consumption. Step-6 may reduce such disadvantages. Specifically, at Step-6, both of the word lines WL2 and WL3 are applied with a voltage to turn them off, thereby reducing a short circuit between the bit line BL and the plate line PL.

Information is then erased in the ferroelectric memory cell including the ferroelectric capacitor 31 and the transistor 21.

Specifically, at Step-8, with both of the word lines WL3 and WL4 being applied with a voltage sufficient to turn them on and the word line WL2 being applied with a voltage to turn it off, the word line WL1 is applied with a voltage to turn it off. The selection transistor (BS) 11 remains on.

Then at Step-9, with both of the word lines WL3 and WL4 being applied with a voltage sufficient to turn them on, the word line WL1 being applied with a voltage to turn it off, and the selection transistor (BS) 11 being on, the word line WL2 is applied with a voltage to turn it on. Only the transistor 21 is thus off, so the voltage applied between the bit line BL and the plate line PL is applied to the ferroelectric capacitor 31, thereby erasing information stored in the ferroelectric capacitor 31.

This embodiment includes Step-8 for the following reason. If control directly proceeds from Step-7 to Step-9, the switching timing between the transistors 21 and 22 may turn on all of the selection transistor (BS) 11 and transistors 21, 22, 23, and 24. This may short the bit line BL and the plate line PL, thus flowing a through current. The through current may destruct devices such as a transistor or increase the power consumption. Step-8 may reduce such disadvantages. Specifically, at Step-8, both of the word lines WL1 and WL2 are applied with a voltage to turn them of f, thereby reducing a short circuit between the bit line BL and the plate line PL.

Then at Step-10, with all of the word lines WL2, WL3, and WL4 being applied with a voltage sufficient to turn them on and the word line WL1 being applied with a voltage to turn it off, the selection transistor (BS) 11 is turned off.

Then at Step-11, with all of the word lines WL2, WL3, and WL4 being applied with a voltage sufficient to turn them on and the selection transistor (BS) 11 being off, the word line WL1 is applied with a voltage to turn it on.

This embodiment includes Step-10 for the following reason. If control directly proceeds from Step-9 to Step-11, the switching timing between the selection transistor (BS) 11 and the transistor 21 may turn on all of the selection transistor (BS) 11 and transistors 21, 22, 23, and 24. This may short the bit line BL and the plate line PL, thus flowing a through current. The through current may destruct devices such as a transistor or increase the power consumption. Step-10 may reduce such disadvantages. Specifically, at Step-10, the word line WL1 is applied with a voltage to turn it off and the selection transistor (BS) 11 is turned off, thereby reducing a short circuit between the bit line BL and the plate line PL.

In this way, erasing of the ferroelectric memory cells in the block is completed.

[Write Method]

Figure 5:
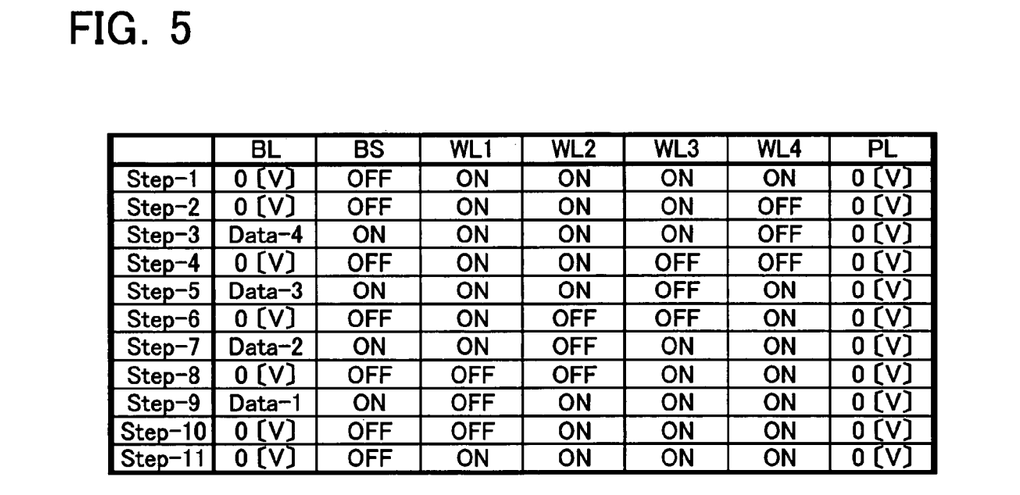
FIG. 5 shows steps of a method of writing a ferroelectric semiconductor memory device in a first embodiment.

Referring to FIG. 5, a method of writing to the ferroelectric memory cell in the block shown in FIG. 3 is described.

It is assumed that before writing, information in the block to be written is erased. The information is erased as describe above.

The ferroelectric memory cell in the block in this embodiment may be written with the plate line PL being applied with a voltage of 0 [V]

Then, at first Step-1, the bit line BL is applied with a voltage of 0 [V], the word lines WL1, WL2, WL3, and WL4 are all applied with a voltage sufficient to turn them on, and the selection transistor (BS) 11 is off.

Information is then written to the ferroelectric memory cell including the ferroelectric capacitor 34 and the transistor 24.

Specifically, at Step-2, with all of the word lines WL1, WL2, and WL3 being applied with a voltage sufficient to turn them on, the word line WL4 is-applied with a voltage to turn it off. The selection transistor (BS) 11 remains off and the bit line BL remains at a voltage of 0 [V].

Then at Step-3, with all of the word lines WL1, WL2, and WL3 being applied with a voltage sufficient to turn them on and the word line WL4 being applied with a voltage to turn it off, the bit line BL is applied with a voltage corresponding to information Data-4 to be written to the ferroelectric memory cell including the ferroelectric capacitor 34 and the transistor 24, and the selection transistor (BS) 11 is turned on.

When it is desired to write data of 1 corresponding to information Data-4 to be written to the ferroelectric memory cell including the ferroelectric capacitor 34 and the transistor 24, the bit line BL is applied with a voltage of Vcc [V]. When it is desired to write data of 0, the bit line BL is applied with a voltage of 0 [V].

Because only the transistor 24 is off and the bit line BL is applied with a voltage corresponding to the information Data-4 to be written, the voltage applied between the bit line BL and the plate line PL is applied to the ferroelectric capacitor 34, thus writing information to the ferroelectric capacitor 34.

This embodiment includes Step-2 for the following reason. If control directly proceeds from Step-1 to Step-3, the switching timing between the selection transistor (BS) 11 and the transistor 24 may turn on all of the selection transistor (BS) 11 and transistors 21, 22, 23, and 24. This may short the bit line BL and the plate line PL, thus flowing a through current. The through current may destruct devices such as a transistor or increase the power consumption. Step-2 may reduce such disadvantages. Specifically, at Step-2, the word line WL4 is applied with a voltage to turn it off and the selection transistor (BS) 11 is turned off, thus thereby reducing a short circuit between the bit line BL and the plate line PL.

Information is then written to the ferroelectric memory cell including the ferroelectric capacitor 33 and the transistor 23.

Specifically, at Step-4, with both of the word lines WL1 and WL2 being applied with a voltage sufficient to turn them on and the word line WL4 being applied with a voltage to turn it off, the word line WL3 is applied with a voltage to turn it off, the selection transistor (BS) 11 is turned off, and the bit line is applied with a voltage of 0 [V].

This embodiment includes Step-4 to temporarily change the voltage of the bit line BL to 0 [V] to prevent wrong information from being written to the ferroelectric capacitor 34 or 33.

At Step-4, both of the bit line BL and the plate line PL have a voltage of 0 [V], so both of the word lines WL3 and WL4 may also be applied with a voltage sufficient to turn them on. This is because in such a condition no through current will flow.

Then at Step-5, with both of the word lines WL1 and WL2 being applied with a voltage sufficient to turn them on and the word line WL3 being applied with a voltage to turn it off, the word line WL4 is applied with a voltage to turn it on, the bit line BL is applied with a voltage corresponding to information Data-3 to be written to the ferroelectric memory cell including the ferroelectric capacitor 33 and the transistor 23, and the selection transistor (BS) 11 is turned on.

When it is desired to write data of 1 corresponding to the information Data-3 written to the ferroelectric memory cell including the ferroelectric capacitor 33 and the transistor 23, the bit line BL is applied with a voltage of Vcc [V]. When it is desired to write data of 0, the bit line BL is applied with a voltage of 0 [V].

Because only the transistor 23 is off, and the bit line BL is applied with a voltage corresponding to the information Data-3 to be written, the voltage applied between the bit line BL and the plate line PL is applied to the ferroelectric capacitor 33, thus writing information to the ferroelectric capacitor 33.

Information is then written to the ferroelectric memory cell including the ferroelectric capacitor 32 and the transistor 22.

Specifically, at Step-6, with both of the word lines WL1 and WL4 being applied with a voltage sufficient to turn them on and the word line WL3 being applied with a voltage to turn it off, the word line WL2 is applied with a voltage to turn it off, the selection transistor (BS) 11 is turned off, and the bit line is applied with a voltage of 0 [V].

This embodiment includes Step-6 to temporarily change the voltage of the bit line BL to 0 [V] to prevent wrong information from being written to the ferroelectric capacitor 32 or 33.

At Step-6, both of the bit line BL and the plate line PL have a voltage of 0 [V], so both of the word lines WL2 and WL3 may also be applied with a voltage sufficient to turn them on. This is because in such a condition no through current will flow.

Then at Step-7, with both of the word lines WL1 and WL4 being applied with a voltage sufficient to turn them on and the word line WL2 being applied with a voltage to turn it off, the word line WL3 is applied with a voltage to turn it on, the bit line BL is applied with a voltage corresponding to information Data-2 to be written to the ferroelectric memory cell including the ferroelectric capacitor 32 and the transistor 22, and the selection transistor (BS) 11 is turned on.

When it is desired to write data of 1 corresponding to the information Data-2 written to the ferroelectric memory cell including the ferroelectric capacitor 32 and the transistor 22, the bit line BL is applied with a voltage of Vcc [V]. When it is desired to write data of 0, the bit line BL is applied with a voltage of 0 [V].

Because only the transistor 22 is off, and the bit line BL is applied with a voltage corresponding to the information Data-2 to be written, the voltage applied between the bit line BL and the plate line PL is applied to the ferroelectric capacitor 32, thus writing information to the ferroelectric capacitor 32.

Information is then written to the ferroelectric memory cell including the ferroelectric capacitor 31 and the transistor 21.

Specifically, at Step-8, with both of the word lines WL3 and WL4 being applied with a voltage sufficient to turn them on and the word line WL2 being applied with a voltage to turn it off, the word line WL1 is applied with a voltage to turn it off, the selection transistor (BS) 11 is turned off, and the bit line is applied with a voltage of 0 [V].

This embodiment includes Step-8 to temporarily change the voltage of the bit line BL to 0 [V] to prevent wrong information from being written to the ferroelectric capacitor 31 or 32.

At Step-8, both of the bit line BL and the plate line PL have a voltage of 0 [V], so both of the word lines WL1 and WL2 may also be applied with a voltage sufficient to turn them on. This is because in such a condition no through current will flow.

Then at Step-9, with both of the word lines WL3 and WL4 being applied with a voltage sufficient to turn them on and the word line WL1 being applied with a voltage to turn it off, the word line WL2 is applied with a voltage to turn it on, the bit line BL is applied with a voltage corresponding to information Data-1 to be written to the ferroelectric memory cell including the ferroelectric capacitor 31 and the transistor 21, and the selection transistor (BS) 11 is turned on.

When it is desired to write data of 1 corresponding to information Data-1 to be written to the ferroelectric memory cell including the ferroelectric capacitor 31 and the transistor 21, the bit line BL is applied with a voltage of Vcc [V]. When it is desired to write data of 0, the bit line BL is applied with a voltage of 0 [V].

Because only the transistor 21 is off, and the bit line BL is applied with a voltage corresponding to the information Data-1 to be written, the voltage applied between the bit line BL and the plate line PL is applied to the ferroelectric capacitor 31, thus writing information to the ferroelectric capacitor 31.

Then at Step-10, with all of the word lines WL2, WL3, and WL4 being applied with a voltage sufficient to turn them on and the word line WL1 being applied with a voltage to turn it off, the selection transistor (BS) 11 is turned off and the bit line is applied with a voltage of 0 [V].

Then at Step-11, with all of the word lines WL2, WL3, and WL4 being applied with a voltage sufficient to turn them on and the selection transistor (BS) 11 being off, the word line WL1 is applied with a voltage to turn it on.

In this way, writing to the entire block of a ferroelectric memory cell is completed.

This embodiment includes Step-10 for the following reason. If control directly proceeds from Step-9 to Step-11, the switching timing between the selection transistor (BS) 11 and the transistor 21 may turn all of the selection transistor (BS) 11 and transistors 21, 22, 23, and 24 on. This may short the bit line BL and the plate line PL, thus flowing a through current. The through current may destruct devices such as a transistor or increase the power consumption. Step-10 may reduce such disadvantages. Specifically, at Step-10, the word line WL1 is applied with a voltage to turn it off and the selection transistor (BS) 11 is turned off, thereby reducing a short circuit between the bit line BL and the plate line PL.

Although this embodiment illustrates the block including four ferroelectric memory cells, the invention is not limited thereto.

In this embodiment, data is written, without increase or decrease in the voltage of the plate line PL, to the ferroelectric memory cells in the entire block, thus providing a high speed data writing.

[Erase and Write]

The ferroelectric memory cell in the block in this embodiment is erased and written as described above. It is thus necessary to increase and decrease the voltage of the plate line PL one time during one cycle, the plate line PL taking a time to increase or decrease its voltage.

For general writing of information to a plurality of ferroelectric memory cells as shown in FIG. 3 and one block including four ferroelectric memory cells, it is necessary to increase and decrease the voltage of the plate line PL four times during one cycle.

Figure 6:
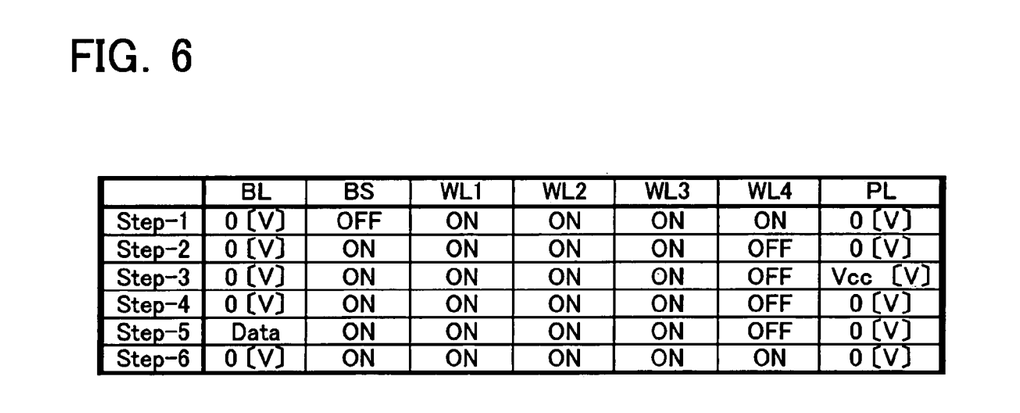
FIG. 6 shows steps of a method of erasing or writing a general ferroelectric semiconductor memory device according to other than the present invention.

Specifically, referring to FIG. 6, first at Step-1, the bit line BL and the plate line PL are both 0 [V], the selection transistor (BS) 11 is off, and the word lines WL1, WL2, WL3, and WL4 are applied with a voltage sufficient to turn them on.

Then at Step-2, the selection transistor (BS) 11 is turned on, and a voltage is applied to the word line WL4 to turn it off.

Then at Step-3, the plate line PL is applied with a voltage of Vcc [V]. Information is thus erased in the ferroelectric capacitor 34 in FIG. 3.

Then at Step-4, the voltage of the plate line PL is changed to 0 [V].

Then at Step-5, the bit line BL is applied with a voltage corresponding to information data to be written. The ferroelectric capacitor 34 is thus applied with a voltage for writing, thereby writing information to the ferroelectric memory cell including the ferroelectric capacitor 34 and the transistor 24.

Then at Step-6, the bit line BL is applied with a voltage of 0 [V], and the word WL4 is applied with a voltage to turn it on.

Information is thus written to one of the ferroelectric memory cells that includes the ferroelectric capacitor 34 and the transistor 24. To write information to one of the ferroelectric memory cells, therefore, it is necessary to increase and decrease the voltage of the plate line PL one time. When, therefore, one block includes four ferroelectric memory cells as shown in FIG. 3, it is necessary to increase and decrease the voltage of the plate line PL four times. As the block includes more ferroelectric memory cells, the number of times of increasing and decreasing the voltage increases.

The plate line PL takes a time to increase and decrease its voltage as described above. In this embodiment, the block may be erased and written, needing only one increase and decrease in the voltage of the plate line PL. This embodiment thus takes less time to store information in the ferroelectric memory than the conventional general methods. Particularly, when the block includes a large number of ferroelectric memory cells, a significant amount of time may be reduced.

Second Embodiment

This embodiment relates to a method of reading information from the TC parallel unit series-connected ferroelectric memory, which is a ferroelectric memory. The entire configuration is similar to that in the first embodiment.

Figure 7:
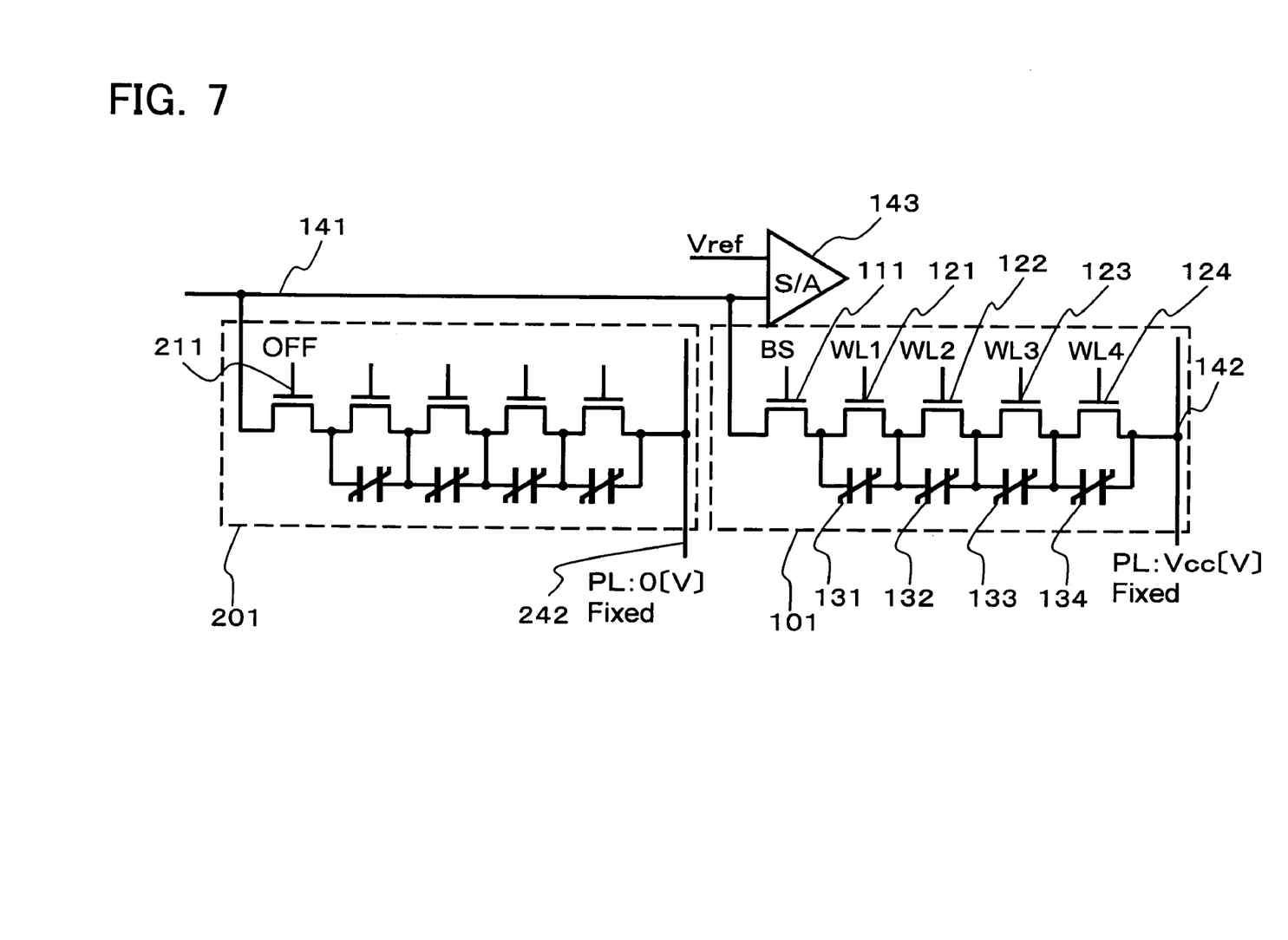
FIG. 7 is a configuration diagram of a ferroelectric memory cell array of a ferroelectric semiconductor memory device in a second embodiment.
Figure 8:
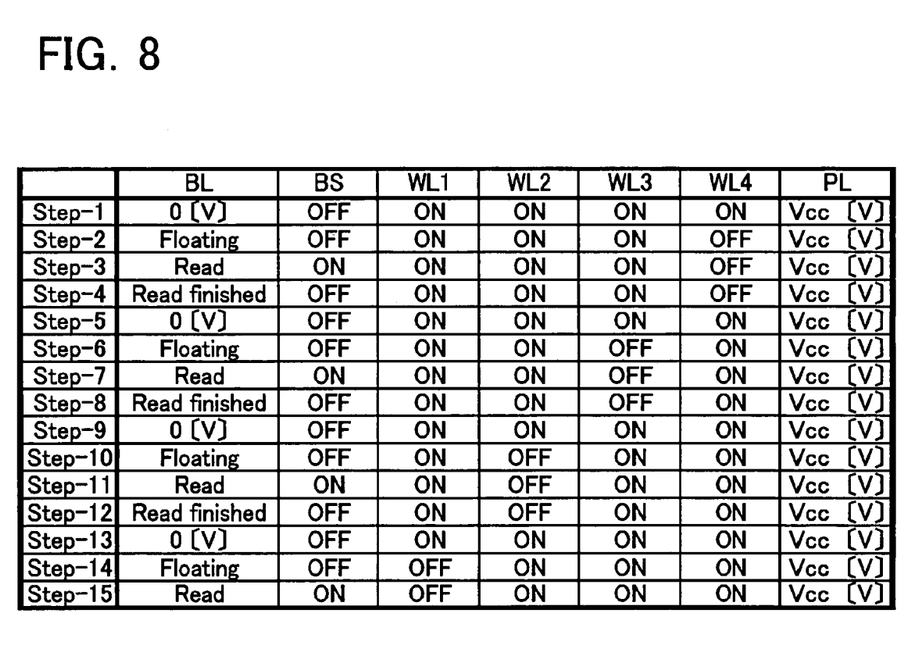
FIG. 8 shows steps of a method of reading a ferroelectric semiconductor memory device in a second embodiment.

FIG. 7 shows a configuration of the block in the TC parallel unit series-connected ferroelectric memory, which is a ferroelectric memory, used in this embodiment. Referring to FIG. 7, the block has a configuration similar to that in the first embodiment. Referring to FIG. 8, a method of reading a ferroelectric memory cell in a block 101 is described below. A plate line (PL) 142 is connected to the block 101 to be read. A plate line (PL) 242 is connected to the other blocks such as a block 201. With the plate line 142 being applied with a voltage of Vcc [V] and the plate line (PL) 242 being applied with 0 [V], the reading is started.

First at Step-1, the selection transistor 111 is turned off. The word lines WL1, WL2, WL3, and WL4 are applied with a voltage sufficient to turn on corresponding transistors 121, 122, 123, and 124, respectively. A bit line (BL) 141 is temporarily applied with 0 [V] for precharge.

Then at Step-2, the word line WL4 is applied with a voltage to turn off the transistor 124 of the ferroelectric memory cell from which information is read, and the bit line (BL) 141 is made electrically floating.

Figure 9A:
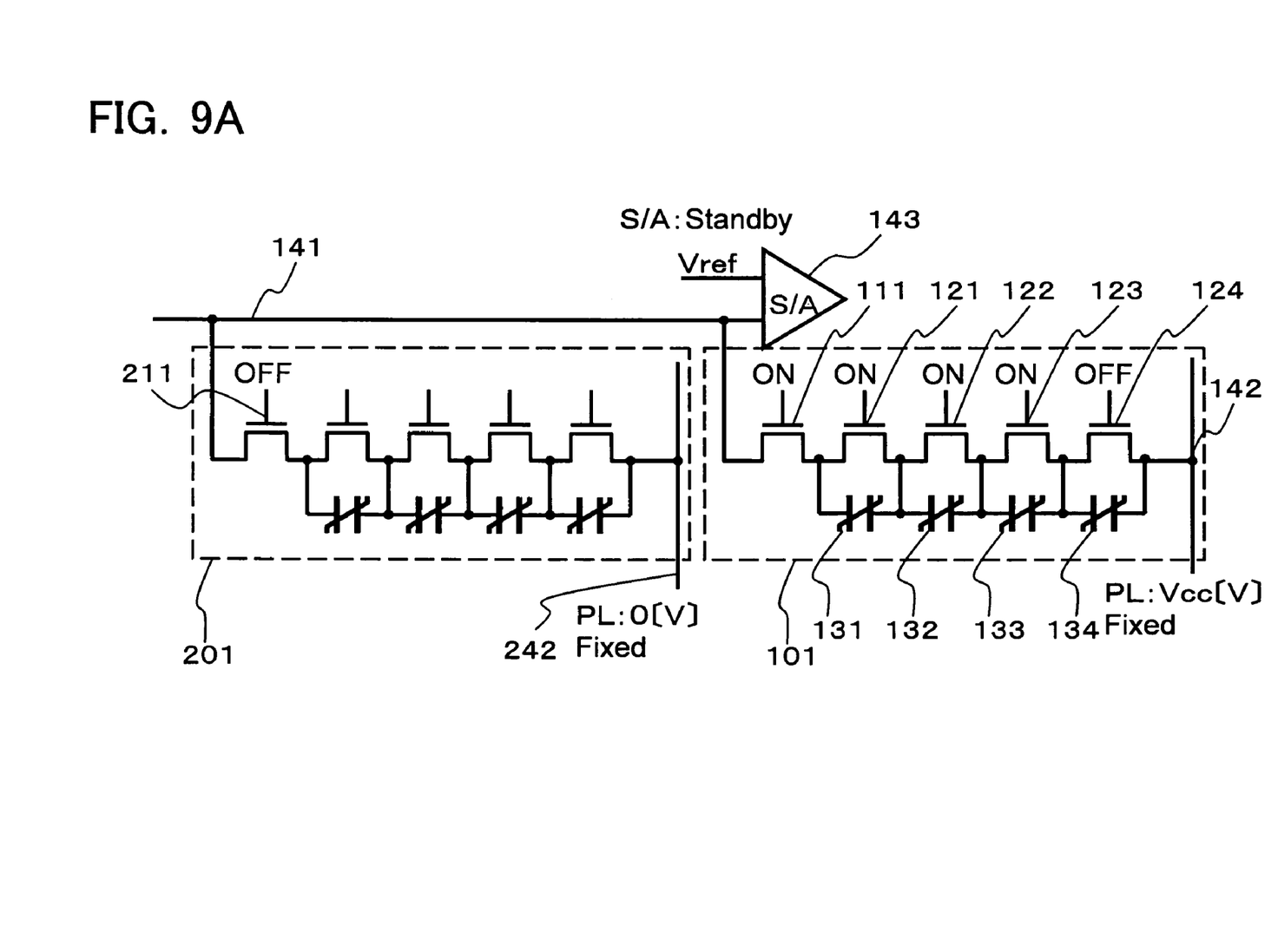
FIG. 9A shows a ferroelectric memory cell array of a ferroelectric semiconductor memory device when it is read in a second embodiment.
Figure 9B:
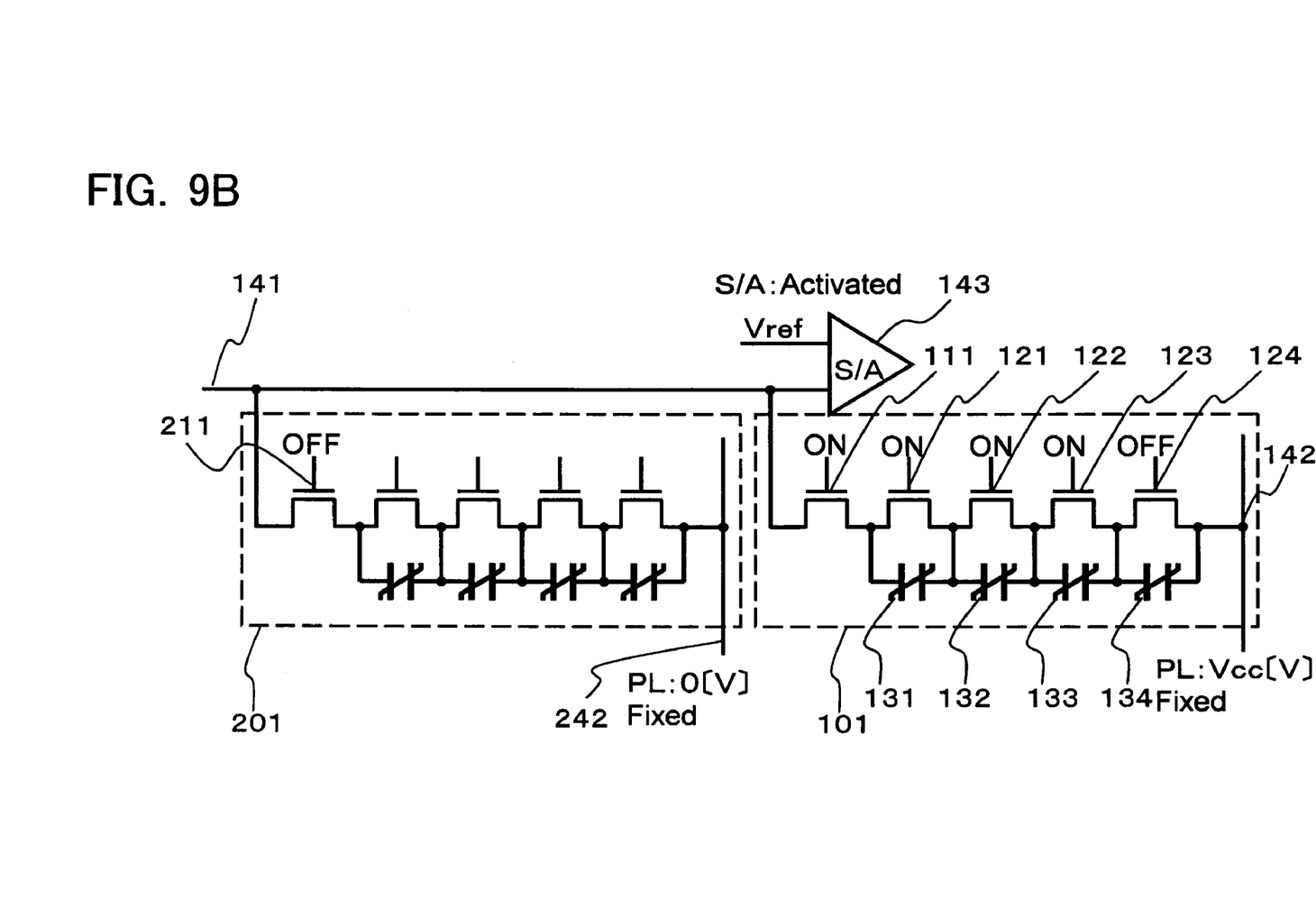
FIG. 9B shows a ferroelectric memory cell array of a ferroelectric semiconductor memory device when it is read in a second embodiment.

Then at Step-3, the selection transistor 111 is turned on to make the bit line (BL) 141 at a potential corresponding to the charge in the ferroelectric capacitor 134 of the ferroelectric memory cell. When data of 0 is recorded in the ferroelectric capacitor 134, the bit line (BL) 141 has a potential of 0 [V]. When data of 1 is recorded, the bit line (BL) 141 has a potential of Vcc [V]. FIG. 9A shows such a condition. In FIG. 9A, the sense amplifier 143 is on a standby state. In FIG. 9B, however, the sense amplifier 143 may start operation to read information recorded in the ferroelectric memory cell.

Then at Step-4, the selection transistor 111 is turned off.

Then at Step-5, the bit line (BL) 141 is applied again with a voltage of 0 [V] for precharge, and the WL4 is applied with a voltage to turn on the transistor 124. The Step-4 is provided to reduce a through current flowing through the transistors in the block 101 when control directly proceeds from Step-3 to Step-5.

Then at Step-6, the WL3 is applied with a voltage to turn off the transistor 123 in the ferroelectric memory cell from which information is read, and the bit line (BL) 141 is made electrically floating.

Then at Step-7, the selection transistor 111 is turned on to make the bit line (BL) 141 at a potential corresponding to the charge in the ferroelectric capacitor 133 of the ferroelectric memory cell. When data of 0 is recorded in the ferroelectric capacitor 133, the bit line (BL) 141 has a potential of 0 [V]. When data of 1 is recorded, the bit line (BL) 141 has a potential of Vcc [V]. The sense amplifier 143 may then start operation to read information recorded in the ferroelectric memory cell.

Then at Step-8, the selection transistor 111 is turned off.

Then at Step-9, the bit line (BL) 141 is applied again with a voltage of 0 [V] for precharge, and the WL3 is applied with a voltage to turn on the transistor 123. The Step-8 is provided to reduce a through current flowing through the transistors in the block 101 when control directly proceeds from Step-7 to Step-9.

Then at Step-10, the WL2 is applied with a voltage to turn off the transistor 122 in the ferroelectric memory cell from which information is read, the bit line (BL) 141 is made electrically floating.

Then at Step-11, the selection transistor 111 is turned on to make the bit line (BL) 141 at a potential corresponding to the charge in the ferroelectric capacitor 132 of the ferroelectric memory cell. When data of 0 is recorded in the ferroelectric capacitor 132, the bit line (BL) 141 has a potential of 0 [V]. When data of 1 is recorded, the bit line (BL) 141 has a potential of Vcc [V]. The sense amplifier 143 may then start operation to read information recorded in the ferroelectric memory cell.

Then at Step-12, the selection transistor 111 is turned off.

Then at Step-13, the bit line (BL) 141 is applied with a voltage of 0[V] for precharge, and the WL3 is applied with a voltage to turn on the transistor 122. The Step-12 is provided to reduce a through current flowing through the transistors in the block 101 when control directly proceeds from Step-11 to Step-13.

Then at Step-14, the WL1 is applied with a voltage to turn off the transistor 121 in the ferroelectric memory cell from which information is read, and the bit line (BL) 141 is made electrically floating.

Then at Step-15, the selection transistor 111 is turned on to make the bit line (BL) 141 at a potential corresponding to the charge in the ferroelectric capacitor 131 of the ferroelectric memory cell. When data of 0 is recorded in the ferroelectric capacitor 131, the bit line (BL) 141 has a potential of 0 [V]. When data of 1 is recorded, the bit line (BL) 141 has a potential of Vcc [V]. The sense amplifier 143 may then start operation to read information recorded in the ferroelectric memory cell.

All information written in the ferroelectric memory cells in the block may thus be read. In this embodiment, one block may be read with the plate line (PL) being held at a constant voltage of Vcc [V] without increase or decrease in the voltage. Information written in the ferroelectric memory cell may be read at a high speed.

Figure 10A:
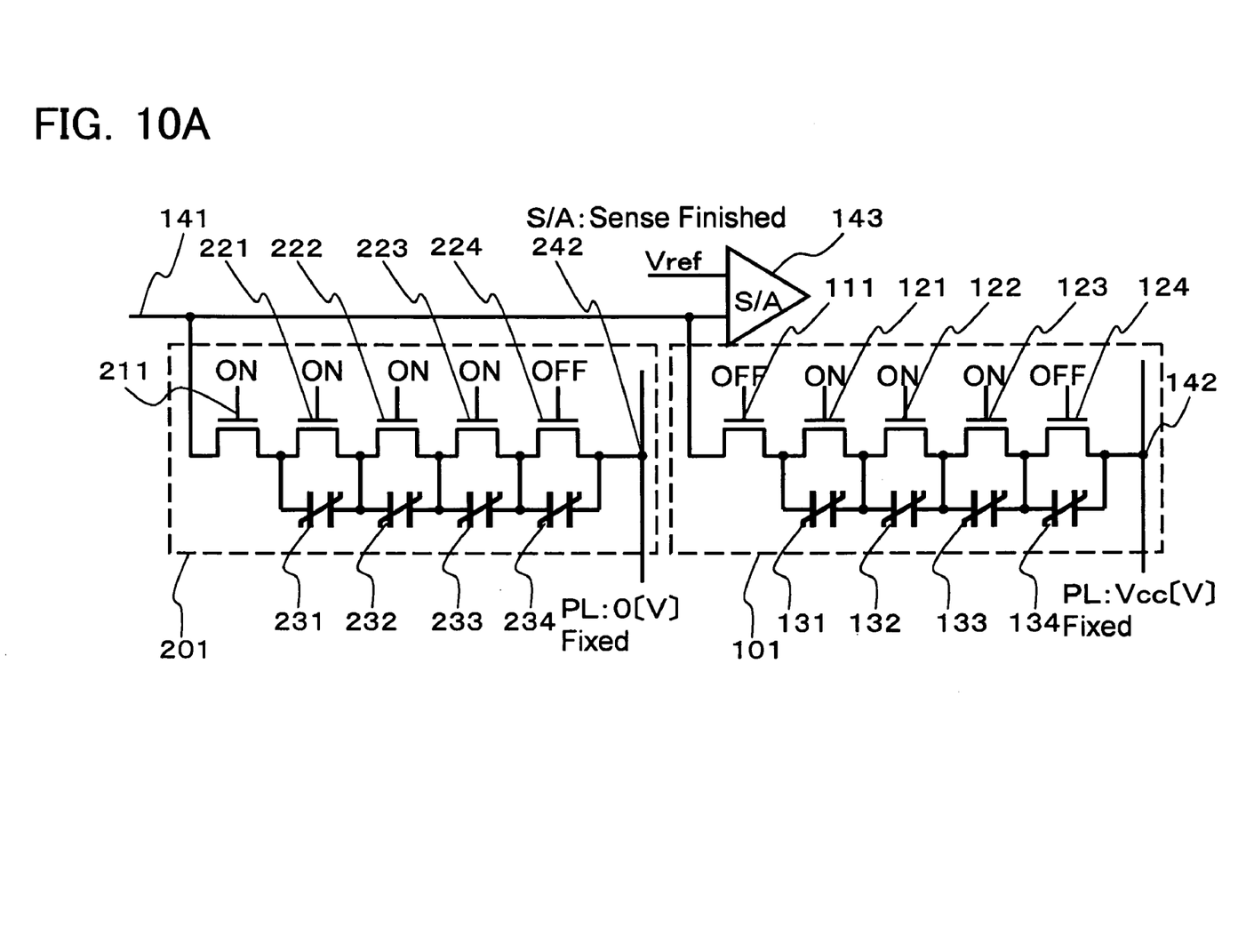
FIG. 10A shows a ferroelectric memory cell array of a ferroelectric semiconductor memory device when it is read and written in a second embodiment.

It is possible to use, after information is read at Step-3, the potential of the bit line 141 to write information to a ferroelectric memory cell in a different block. Specifically, at Step-4, the following operations are executed. The selection transistor 211 in the different block 201 including the ferroelectric memory cell to be written with information is applied with a voltage to turn on the transistor 211. The transistor 224 connected to the ferroelectric capacitor 234 to be written with information is applied with a voltage to turn on the transistor 224. The transistors 221, 222, and 223 connected to the ferroelectric capacitors 231, 232, and 233, respectively, to be written with no information are applied with voltages to turn on the transistors 221, 222, and 223. Through the bit line 141, therefore, the information written to the ferroelectric capacitor 134 of the ferroelectric memory cell may be transferred to the ferroelectric capacitor 234 of the ferroelectric memory cell in the different block 201. FIG. 10A shows such a condition.

It is assumed that information of the block 101 is written to the block 201 whose information is previously erased. The information is erased in a manner as in the first embodiment.

Figure 10B:
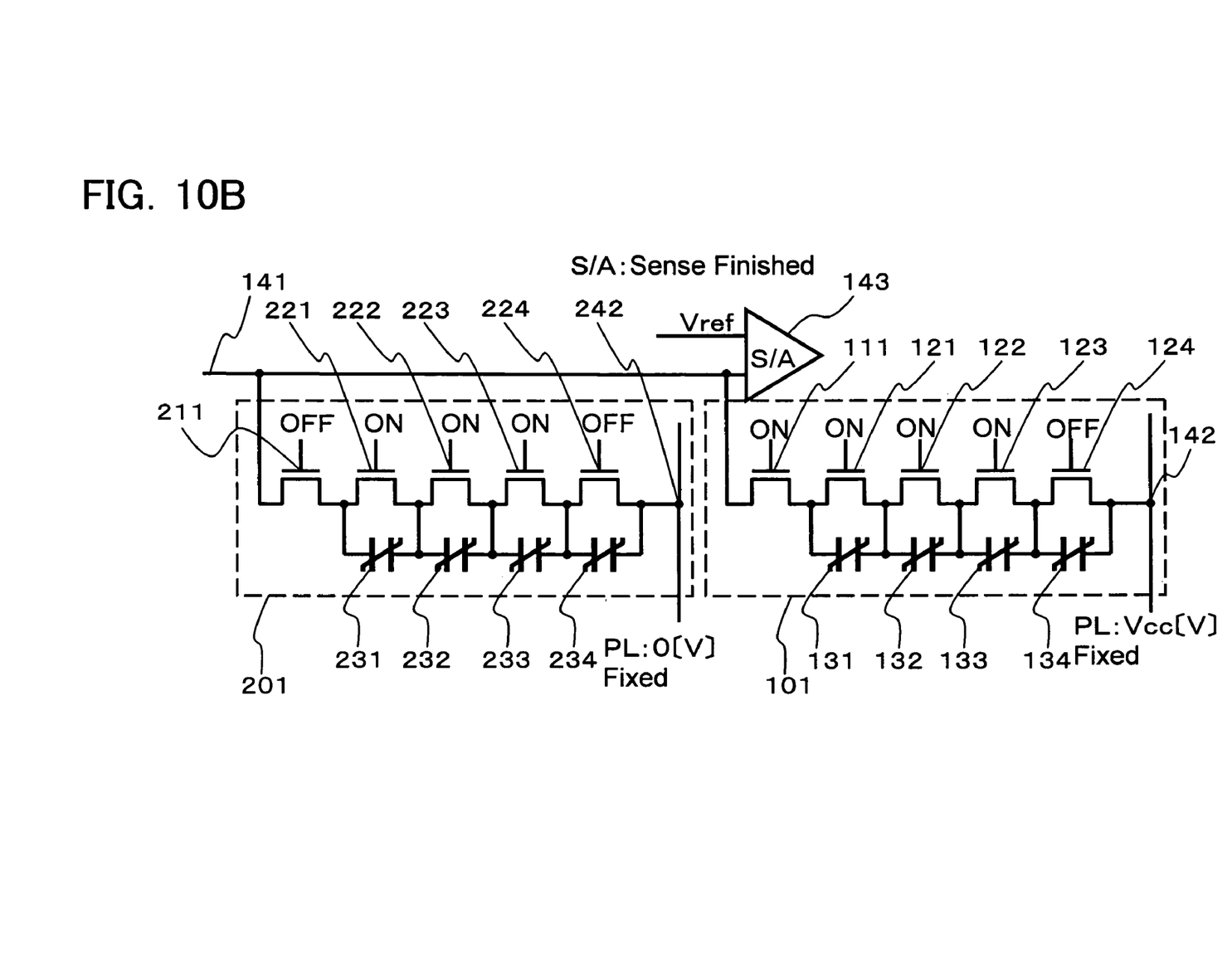
FIG. 10B shows a ferroelectric memory cell array of a ferroelectric semiconductor memory device when it is read and written in a second embodiment.

Then the selection transistor 211 of the different block 201 is turned off, and then at Step-5, the bit line (BL) 141 is applied with 0 [V] for presetting. Then the transistor 124 is temporarily turned off, and the selection transistor 111 is turned on, thus making it possible to erase information written to the ferroelectric capacitor 134 connected to the transistor 124. FIG. 10B shows such a condition. Then, the selection transistor 111 is turned off and the transistor 124 is turned on, then control proceeds to Step-6.

The above operations may be executed for a different ferroelectric memory cell, thus reading information written to a ferroelectric memory cell in the block 101 while transferring that information to a ferroelectric memory cell in the different block 201.

It is assumed that in this method, every time data is read, the data is read from a different ferroelectric memory cell. Information indicating where certain data is stored thus should be stored somewhere. Information on the data storage location in the ferroelectric memory cell is referred to as a block-data allocation table (BAT). The BAT may be provided, for example, on a non-volatile memory included in an external controller of the ferroelectric semiconductor memory device in this embodiment, or be provided using a portion of the ferroelectric semiconductor memory device in this embodiment.

The data storage location should be managed as the BAT, so a corresponding overhead occurs during the reading and writing. The above reading and writing methods should adjust, therefore, the block size to be larger than a size sufficient to adsorb the over head. The BAT needs to be read and written at least one time when reading and writing one block. As the block size increases, however, the time to read and write the BAT per one ferroelectric memory cell may be made negligible. When the erasing is also done, therefore, operations at a higher speed may be provided more advantageously.

When the ferroelectric semiconductor memory device in this embodiment is used as a mass storage device such as a hard disk, the BAT may be used like the file allocation table (FAT). The FAT manages the location of the file data in the ferroelectric memory cell, so it is not awfully disadvantageous to allow the BAT to manage the data storage location.

Thus, ferroelectric semiconductor memory devices according to the preferred embodiments of the present invention have been described in detail, but the present invention is not limited to the embodiments, and other embodiments may also be possible.

What is claimed is:

1. A ferroelectric semiconductor memory device comprising:
    a memory cell block including a plurality of ferroelectric memory cells connected in series, each memory cell including a ferroelectric capacitor for holding a charge and a transistor connected in parallel with the ferroelectric capacitor;
    word lines connected to the respective transistors;
    a selection transistor connected to one end of the block;
    a bit line connected to the selection transistor;
    a plate line connected to another end of the block; and
    a control circuit for changing potentials of the word line and the bit line,
    with the potential of the plate line being held constant, the potential of the word line being changed, thereby erasing information or writing information to the ferroelectric memory cells,
    the information of the memory cells included in the block being erased by sequentially executing steps comprising:
        a first step of turning on, with the selection transistor being held off, all of the transistors;
        a second step of switching, with the selection transistor being held off, one of the transistors from on to off; and
        a third step of switching, with the one of the transistors being held off, the selection transistor from off to on,
    the potential of the bit line and the potential of the plate line being held constant during the first step to the third step.

2. The ferroelectric semiconductor memory device according to claim 1, further comprising:

a fourth step of switching, with the one of the transistors being held off, a transistor adjacent to the one of the transistors from on to off; and a fifth step of switching the one of the transistors from off to on.

3. The ferroelectric semiconductor memory device according to claim 1, wherein the information is written by sequentially changing the potential of the word line for each of the ferroelectric memory cells, and then applying to the bit line a potential corresponding to information to be written, thereby writing information to all of the ferroelectric memory cells included in the block.

4. A ferroelectric semiconductor memory device comprising:

a memory cell block including a plurality of ferroelectric memory cells connected in series, each memory cell including a ferroelectric capacitor for holding a charge and a transistor connected in parallel with the ferroelectric capacitor:

word lines connected to the respective transistors;

a selection transistor connected to one end of the block;

a bit line connected to the selection transistor;

a plate line connected to another end of the block; and a control circuit for changing potentials of the word line and the bit line.

with the potential of the plate line being held constant, the potential of the word line being changed, thereby erasing information or writing information to the ferroelectric memory cells.

the information being written to the memory cells included in the block by sequentially executing steps comprising:

a first step of turning on, with the selection transistor being held off, all of the transistors;

a second step of switching, with the selection transistor being held off, one of the transistors from on to off; and a third step of switching, with the one of the transistors being held off, the selection transistor from off to on, and applying to the bit line a potential corresponding to information to be written.

5. The ferroelectric semiconductor memory device according to claim 4, further comprising:

a fourth step of switching, with the one of the transistors being held off, a transistor adjacent to the one of the transistors from on to off; and a fifth step of switching the one of the transistors from off to on, and applying to the bit line a potential corresponding to information to be written.

6. A ferroelectric semiconductor memory device comprising:

a memory cell block including a plurality of ferroelectric memory cells connected in series, each memory cell including a ferroelectric capacitor for holding a charge and a transistor connected in parallel with the ferroelectric capacitor;

word lines connected to the respective transistors;

a selection transistor connected to one end of the block:

a bit line connected to the selection transistor;

a plate line connected to another end of the block; and a control circuit for changing potentials of the word line and the bit line, the information of the memory cells included in the block being read by sequentially executing steps comprising:

a first step of turning on, with the selection transistor being held off, all of the transistors;

a second step of switching, with the selection transistor being held off, one of the transistors from on to off, and then the bit line being made electrically floating; and a third step of switching, with the one of the transistors being held off, the selection transistor from off to on.

the potential of the plate line being held constant during the first step to the third step.

7. The ferroelectric semiconductor memory device according to claim 6, wherein reading information by changing the potential of the word line is sequentially executed for each of the ferroelectric memory cells, thereby reading information of all of the ferroelectric memory cells included in the block.

8. The ferroelectric semiconductor memory device according to claim 7, further comprising:

a fourth step of switching the selection transistor from on to off; and a fifth step of precharging the bit line to a fixed potential, and then switching the one of the transistors from off to on.

9. The ferroelectric semiconductor memory device according to claim 6, wherein a plurality of the blocks commonly connect to one bit line, and wherein when information is read from one of the blocks, at a timing the reading is completed, the selection transistor connected to the block sharing the bit line is switched from off to on.

10. A method of writing or erasing information of a ferroelectric semiconductor memory device including:

a memory cell block including a plurality of ferroelectric memory cells connected in series, each memory cell including a ferroelectric capacitor for holding a charge and a transistor connected in parallel with the ferroelectric capacitor;

word lines connected to the respective transistors;

a selection transistor connected to one end of the block;

a bit line connected to the selection transistor; and a plate line connected to another end of the block, the method comprising:

a first step of turning on, with the selection transistor being held off, all of the transistors in the block;

a second step of switching, with the selection transistor being held off, one of the transistors from on to off; and a third step of switching, with the one of the transistors being held off, the selection transistor from off to on.

11. The ferroelectric semiconductor memory device according to claim 10, further comprising:

a fourth step of switching, with the one of the transistors being held off, a transistor adjacent to the one of the transistors from on to off; and a fifth step of switching the one of the transistors from off to on.

* * * * *